(12) United States Patent
Braeges et al.

(10) Patent No.: US 6,355,881 B1
(45) Date of Patent: Mar. 12, 2002

(54) MEANS FOR SEALING AN ELECTRONIC OR OPTICAL COMPONENT WITHIN AN ENCLOSURE HOUSING

(76) Inventors: Brant P. Braeges, 6805 Jenks Rd., Lima, NY (US) 14485; David A. Rich, 15 Rawhide Dr., West Henrietta, NY (US) 14586

( * ) Notice: Subject to any disclaimer, the term of this patent is extended or adjusted under 35 U.S.C. 154(b) by 371 days.

(21) Appl. No.: 08/850,470

(22) Filed: May 5, 1997

(51) Int. Cl.[7] ............................. H01L 23/28; H05K 5/06
(52) U.S. Cl. ................... 174/52.2; 174/52.3; 174/52.5; 257/433; 257/434; 257/680; 257/687
(58) Field of Search ............................. 174/52.2, 52.3, 174/52.5; 257/433, 434, 680, 687

(56) References Cited

U.S. PATENT DOCUMENTS

| | | | |
|---|---|---|---|
| 3,469,148 A | 9/1969 | Lund | 317/101 |
| 3,801,728 A | 4/1974 | Gallo, Jr. et al. | 174/52.4 |
| 4,697,203 A | 9/1987 | Sakai et al. | 257/681 |
| 5,037,779 A * | 8/1991 | Whalley et al. | 473/211 |
| 5,115,298 A | 5/1992 | Loh | 357/70 |
| 5,227,661 A | 7/1993 | Heinen | 257/669 |
| 5,245,215 A | 9/1993 | Sawaya | 257/676 |
| 5,258,650 A * | 11/1993 | Polak et al. | 257/788 |
| 5,352,633 A | 10/1994 | Abbott | 427/211 |
| 5,373,627 A | 12/1994 | Grebe | 29/841 |
| 5,564,181 A | 10/1996 | Dineene et al. | 29/836 |
| 5,604,372 A * | 2/1997 | Yamaguchi | 257/417 |
| 5,690,773 A * | 11/1997 | Fidalgo et al. | 156/257 |

\* cited by examiner

*Primary Examiner*—William A. Cuchlinski, Jr
*Assistant Examiner*—Ronnie Mancho
(74) *Attorney, Agent, or Firm*—Clinton S. Janes, Jr.

(57) ABSTRACT

A package assembly consisting of an electronic and/or optical component mounted on a circuit board and sealed to a housing, the housing having a hole therethrough to provide access to the component and being filled with an organic encapsulant material, the seal surrounding the access hole to prevent flow of the encapsulant material therethrough, wherein the seal consists of an integral sealing member having an aperture therethrough in alignment with the access hole and being prepared from a gel-type material, the preferred gel-type material being a silicone and/or fluorosilicone.

7 Claims, 1 Drawing Sheet

MEANS FOR SEALING AN ELECTRONIC OR OPTICAL COMPONENT WITHIN AN ENCLOSURE HOUSING

FIELD OF THE INVENTION

This invention relates generally to a method for creating a seal and/or an internal dam between an electronic and/or optical component mounted on a circuit board assembly and an enclosure housing, and to provide an integral sealing member for use in creating said seal and/or internal dam. More particularly, this invention is directed to the use of an integral sealing member, such as a gasket, exhibiting mechanical, physical, and thermal properties which enables the enclosure housing to be filled with a flowing encapsulation compound while inhibiting the blockage or leakage of encapsulating compound through access holes located in the housing prior to and during the curing of the encapsulation compound.

BACKGROUND OF THE INVENTION

The manufacture of electronic packages or assemblies comprising a semiconductive element or an electronic component sealed to and encapsulated within a housing filled with a liquid encapsulation material, said material commonly consisting of a thermosetting organic polymer, which is subsequently cured to a solid, is well known in the art. U.S. Pat. Nos. 3,469,148 (Lund), U.S. Pat. No. 3,801,728 (Gallo, Jr. et al.), and U.S. Pat. No. 4,697,203 (Sakai et al) are illustrative of such devices. Lund is particularly instructive describing the basic features in the design of such devices. The patent concerns an integrated circuit assembly in which a semiconductive element is attached to a circuit board and wire bonded into the circuit on the board, with the resultant assembly being encapsulated in an organic plastic. Means are provided to isolate the enclosing plastic material from the filamentary wire bonds interconnecting the semiconductive element and the electrical surface. As illustrated there, a ceramic or plastic cover is bonded to the circuit board by means of an adhesive to isolate that portion of the circuit board enclosed within the cover such that the encapsulating plastic filling material cannot contact the surface portion of the circuit board within the cover. The bonding material is stated to be a low melting glass or an organic adhesive.

Gallo, Jr. et al. discloses the manufacture of microelectronic packages wherein polymide impregnated, woven glass fiber layers are utilized for bonding assembly members. Sakai et al. describe the fabrication of semiconductor devices wherein seals are provided via a thin film of a resilient material.

A problem occurs when an electronic or optical component such as an externally adjustable potentiometer, a light emitting diode (LED), or a liquid crystal display (LCD) is placed within a housing that will ultimately be filled with a liquid encapsulation material, such material frequently being referred to as "potting compound". Prior to curing from a viscous liquid to a solid, the potting material goes through a low viscosity liquid phase where the material seeks to flow into undesired areas of the electronic or optical components, thereby either obstructing visual signals or seizing mechanical aspects of components requiring manual adjustments. Additionally, the encapsulant can flow out of the housing through unprotected holes therein, thereby necessitating reworking or scrapping of the final assembly. Finally, the encapsulant can flow into areas of the circuit board hazarding damage to electronic and/or electrochemical components.

SUMMARY OF THE INVENTION

The primary objective of the present invention is to provide a method for creating a seal and/or an internal dam between an electronic or optical component mounted on a circuit board assembly and an enclosure housing, wherein said electronic or optical component is externally adjustable, and/or has external leads, and/or performs a visual indicator function requiring an external access through the housing, said seal and/or dam being capable of preventing the flow of encapsulating material into undesired areas of the electronic or optical component and out through unprotected holes in the housing.

Another objective was to devise an integral sealing member for providing such a seal and/or internal dam which would act as a cushion to prevent damage from movement of the potting material during thermal cycling and from mechanical shock, vibration, and/or temperature extremes experienced in normal operation of the final assembly.

We have found that those and other objectives which will become apparent from the following description can be achieved through the use of an integral sealing member comprising a gel-type material exhibiting very low durometer/low shear stress such as to be basically a semi-solid, jelly-like substance, which material is capable of withstanding temperature extremes of −65° C. to 155° C., and which demonstrates adhesive tack for excellence in sealing.

General Description of the Invention

Prior to this invention, sealing of access holes in electronic assemblies of the type described hereinabove was conventionally performed utilizing one of the following materials or a combination of two or more thereof: dispensed sealants, cured foams, elastomeric gasket materials, or cardboard. Each material was subject to at least one serious drawback when employed to create a seal between electronic or optical components and the supporting housing. Such drawbacks included:

(1) The dispensing of a bead of material great enough to form a seal bridging a wide gap cannot be reliably and reproducibly accomplished during the assembly procedure, thereby leading to leakage of the potting material.

(2) Rigid, preformed gaskets fashioned from elastomeric compounds cannot fill the minor imperfections that may be present in the housing or the features which are necessarily molded in on the face of the electronic or optical component.

(3) It is customary to employ an adhesive to secure a preformed gasket to assure that it will not move during post assembly operations. The temperature at which the encapsulant (potting compound) is generally cured is not compatible with common adhesives, thereby resulting in leakage of the encapsulant.

(4) Preformed gaskets can become hard and brittle or they can shrink during the thermal cure of the potting compound which limits their ability to seal and cushion.

(5) A rigid spacer a gasket fashioned from elastomeric materials cannot reliably conform to the stack-up manufacturing tolerances presented in a formed or molded enclosure, in a circuit board, or in electronic/electromechanical components, as well as tolerances associated with the final assembly of the components.

We have found that the ideal sealant material for use in above-described package assemblies, and which is not subject to the above-described drawbacks, will exhibit the following mechanical physical, and thermal characteristics:

(a) it can withstand temperatures ranging from −65° C. up to 155° C.;

(b) it can be readily die cut punched, or otherwise shaped;

(c) it exhibits low durometer/low shear;

(d) it exhibits adhesive tack at ambient temperature to provide good sealing;

(e) it maintains sufficient fluid resistance during the curing procedure for the encapsulant to prevent leakage of the encapsulant; and (f) is essentially a semi-solid, jelly-like substance, but which demonstrates sufficient structural integrity such that it does not creep or flow during the fabrication of the assembly.

DESCRIPTION OF A PREFERRED EMBODIMENT

Figure 1:
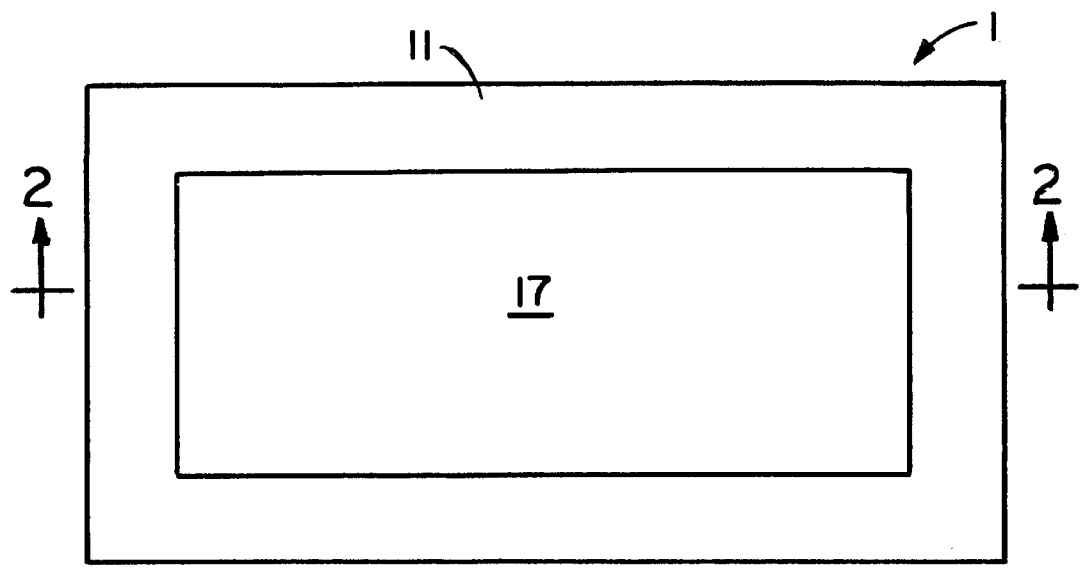
FIG. 1 comprises a top plan view of inventive package assembly 1.
Figure 2:
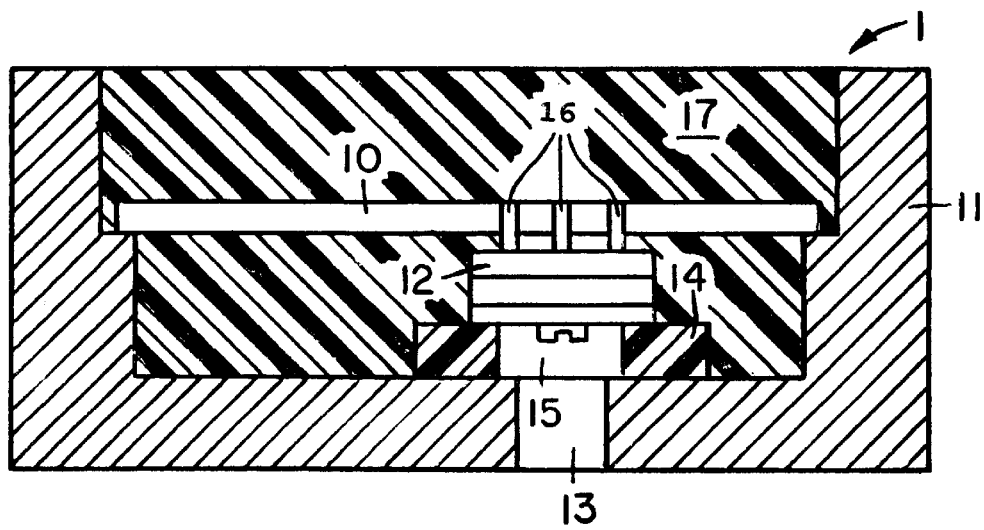
FIG. 2 comprises a cross section of FIG. 1 and a package assembly of the type to which the present invention is directed, but wherein the inventive integral sealing member is pictured.

As can be observed in FIG. 2, the inventive package assembly 1 involves a circuit board 10, which is commonly composed of organic plastic, but may be a ceramic, which is bonded to the side walls of housing 11. Said housing is generally composed of a metal, but may be fashioned from a ceramic or an organic plastic. An externally adjustable electronic component or an optical component which performs a visual indicator function 12 requiring an external access through housing 11 is connected to circuit board 10. Hole 13 in the bottom of housing 11 provides external access to said electronic or optical component 12. Said electronic or optical component 12 is secured to housing 11 over access hole 13 via inventive sealing member 14, which member has an aperture 15 therethrough aligned with access hole 13. In FIG. 2, said component 12 comprises an externally adjustable potentiometer having leads 16 extending through and bonded to circuit board 10. Encapsulant 17, conveniently an organic polymer which is preferably thermosetting, fills the void in housing 11. It will be recognized that more than one electronic and/or optical component may be present within housing 11, each of which will be aligned with an access hole 13 and sealed to housing 11 through inventive sealing member 14.

The lateral size and configuration of sealing member 14 is not critical so long as leakage of encapsulant 17 is prevented. For example, sealing members 14 in the convenient form of gaskets having rectilinear or circular dimensions can be utilized. Likewise, the size and configuration of aperture 15 in sealing member 14 and that of access hole 13 in housing 11 are not critical, but are dependent upon the electronic and/or optical component present in the overall package. Finally, the thickness dimension of sealing member 14 is not critical so long as a tight seal is made and a cushioning effect is provided. Experience has demonstrated that thicknesses between about 0.5–10 mm perform quite satisfactorily. Excessively thick sealing members add to the cost of the package and can lead to difficulties in the assembly of and in the performance of the final package.

We have found two materials to be eminently suitable for use as sealing member 14. One is marketed by Raychem Corporation, Menlo Park, Calif. under the trademark GELTEK®, and the second is marketed by MH&W International Corporation, Mahwah, N.J. under the trademark KERATHERM®. Both products can be purchased in convenient strip form which can be readily cut into gaskets of desired shapes and holes punched or die cut therein. These products are prepared from silicones and/or fluorosilicones which may have inert powder fillers, e.g., ceramic powders, to vary the physical consistency of the silicone and/or fluorosilicone, as well as the mechanical and thermal properties thereof. Whereas the silicone-and/or fluorosilicone-based products are to be preferred, urethane-based materials demonstrating the required properties can be operable. Although the three above-described products are available commercially and have been used in such applications as corrosion protection for metals and as protective exterior wraps for electrical connectors, we are not aware of the use of them as an integral sealing member in package assemblies containing rigid, elastomeric, and organic polymer potting compounds, and as a cushion to protect electronic and/or optical components during temperature cycling and from mechanical abuse during fabrication and use of the package assemblies.

The most preferred material for the inventive gaskets comprises a silicone.

We claim:

1. In a package assembly comprising an electronic and/or an optical component mounted on a circuit board, both said circuit board and said electronic and/or optical component being sealed to a housing, said housing having a hole therethrough to provide access to said electronic and/or optical component and being filled with an organic polymer encapsulating material that is cured in place, said electronic and/or optical component being sealed to said housing around said access hole through sealing material surrounding said access hole to prevent flow of said encapsulating material therethrough during curing thereof, the improvement comprising an integral sealing member as said sealing material surrounding said access hole, said integral sealing member having an aperture therethrough in alignment with said access hole to seal said electronic and/or optical component to said housing, said integral sealing member exhibiting the following mechanical, physical, and thermal characteristics:

(a) it can withstand temperatures ranging from –65° C. up to 155° C.;

(b) it can be readily die cut, punched, or otherwise shaped;

(c) it exhibits low durometer/low shear stress;

(d) it exhibits adhesive tack at ambient temperature;

(e) it maintains sufficient fluid resistance during the curing procedure for said encapsulating material to prevent leakage of said encapsulating material; and (f) it is essentially a semi-solid, jelly-like substance which demonstrates sufficient structural integrity such that it does not creep or flow during fabrication of said package assembly.

2. A package assembly according to claim 1 wherein said integral sealing member comprises a gasket of a gel-type material.

3. A package assembly according to claim 2 wherein said gel-type material is at least one member selected from the group consisting of a silicone, a fluorosilicone, and a urethane.

4. A package assembly according to claim 3 wherein said gel-type material consists of a silicone.

5. A package assembly according to claim 2 wherein said gasket has a thickness dimension of between about 0.5–10 mm.

6. A package assembly according to claim 3 wherein said gasket has a thickness dimension of between about 0.5–10 mm.

7. A package assembly according to claim 4 wherein said gasket has a thickness dimension of between about 0.5–10 mm.

* * * * *